United States Patent [19]

Akiba et al.

[11] Patent Number: 4,701,930
[45] Date of Patent: Oct. 20, 1987

[54] DISTRIBUTED FEEDBACK SEMICONDUCTOR LASER

[75] Inventors: Shigeyuki Akiba, Tokyo; Katsuyuki Utaka, Musashino; Kazuo Sakai, Tokyo; Yuichi Matsushima, Tanashi, all of Japan

[73] Assignee: Kokusai Denshin Denwa Kabushiki Kaisha, Tokyo, Japan

[21] Appl. No.: 764,217

[22] Filed: Aug. 9, 1985

[30] Foreign Application Priority Data

Aug. 15, 1984 [JP] Japan .................................. 59-170143

[51] Int. Cl.$^4$ ............................................... H01S 3/19
[52] U.S. Cl. ........................................ 372/96; 372/50
[58] Field of Search .............................. 372/96, 50, 46

[56] References Cited

U.S. PATENT DOCUMENTS 4,096,446  6/1978  Hans et al. .............................. 372/96
4,665,528  5/1987  Chinone et al. ....................... 372/96

Primary Examiner—James W. Davie
Attorney, Agent, or Firm—Robert E. Burns; Emmanuel J. Lobato

[57] ABSTRACT

A distributed feedback semiconductor laser, in which the periodic corrugations in the first region and the second region of the light emitting region of the DFB laser have different lengths or depths to make the intensities of the Bragg reflection of the first region and the second region different from each other, thereby obtaining asymmetrical light outputs from the both sides of the DFB laser.

3 Claims, 3 Drawing Figures

DISTRIBUTED FEEDBACK SEMICONDUCTOR LASER

BACKGROUND OF THE INVENTION

The present invention relates to a distributed feedback semiconductor laser (hereinafter referred to simply as a "DFB laser") which is provided with a diffraction grating having a phase shift corresponding to a quarter wavelength of light so as to implement a stable singlewave-length operation.

The DFB laser is now being developed as a light source for low-loss optical fiber communications because it incorporates a diffraction grating of excellent wavelength selectivity and is able to perform a single-wavelength operation with ease. In particular, the DFB laser of the type in which the phase of the diffraction grating is shifted at the center portion thereof by a quarter of the wavelength of light is excellent in the selectivity of a single wavelength, and it is also expected that its production yield will be increased. Conventional phase-shift DFB laser are excellent in the selectivity of single wavelength but have an inefficient structure in terms of laser efficiency.

SUMMARY OF THE INVENTION

An object of the present invention is to provide a phase-shift DFB laser in which the laser outputs from its both sides are asymmetrical so as to obviate the abovesaid defect of the prior art.

The present invention is characterized in that the periodic corrugations in the first region and the second region of the light emitting region of the DFB laser have different lengths or depths to make the intensities of the Bragg reflection of the first region and the second region different from each other, thereby obtaining asymmetrical light outputs from the both sides of the DFB laser.

BRIEF DESCRIPTION OF THE DRAWINGS

The present invention will be described in detail below in comparison with prior art with reference to the accompanying drawings; in which.

DETAILED DESCRIPTION

To make differences between prior art and the present invention clear, an example of prior art will first be described.

Figure 1:
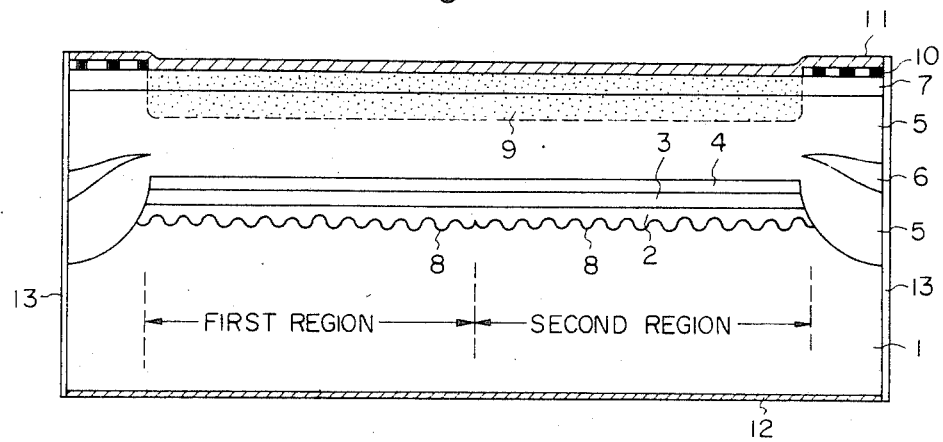
FIG. 1 is a schematic section showing a conventional phase-shift DFB laser.

FIG. 1 is a schematic sectional view taken along the direction of travel of light, showing a conventional phase-shift DFB laser formed of materials of the InGaAsP/InP semiconductor series. On an n-type InP substrate 1 are sequentially laminated a wave-guide layer 2, a light emitting layer 3 and a meltback preventing buffer layer 4 which are formed of InGaAsP, and a p-typed InP layer 5, and in this example, a window structure of the type that is filled with a p-type InP layer 5 and an n-type InP layer 6 is provided in either direction of extension of a laser region including the light emitting layer 3. An n-type InGaAsP cap layer 7 is to set up a current path by forming a zinc diffused region 9 as a p-type region and to provide good electrical contact with a p-side electrode 11. Reference numeral 10 indicates an SiO$_2$ insulating film, 12 an n-side electrode and 13 an antireflection film for effectively obtaining the output light of the laser. Periodic corrugations 8, in this case, are provided in the waveguide layer 2 adjoining the light emitting layer 3, and their phases in a first region and a second region on both sides of the center of the light emitting region are shifted by one fourth of the wavelength of light in the laser. Such a DFB laser performs a stable single-wavelength operation just at the Bragg wavelength.

With the structure of FIG. 1, as viewed in terms of the laser output, since the structures of the first region and the second region ar substantially symmetrical with respect to the phase transition point, the outputs from the first region and the second region are equal to each other. In actual optical fiber communication and so on, however, since only one of the outputs is used and the other is employed merely for monitoring purpose, it is extremely inefficient to provide equal outputs from the both sides. Thus, the conventional phase-shift DFB laser, though excellent in the selectivity of a single wavelength, has an inefficient structure in terms of laser efficiency.

With reference to the accompanying drawings, the present invention will hereinafter be described in detail.

(Embodiment 1)

Figure 2:
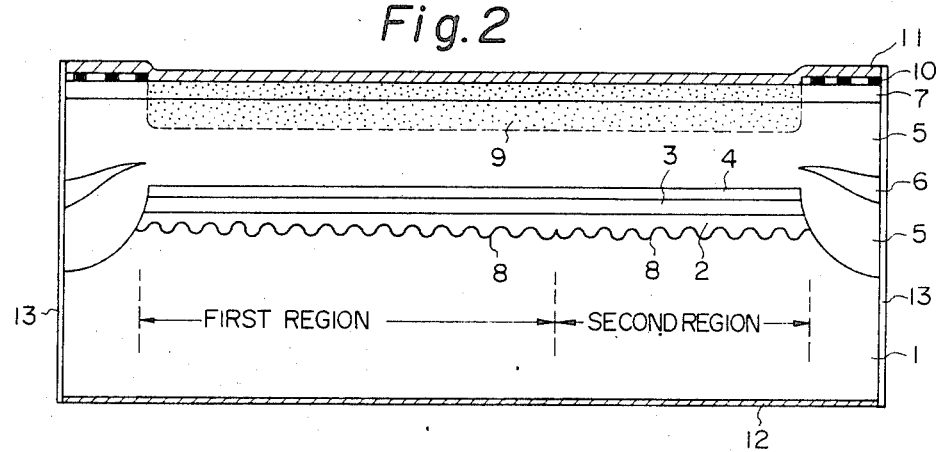
FIGS. 2 and 3 are schematic sections illustrating phase-shift DFB lasers of the present invention.

FIG. 2 illustrates an embodiment of the present invention, in which the periodic corrugations 8 (hereinafter referred to as a "diffraction grating") formed in the waveguide layer 2 have the same shape as that shown in FIG. 1 but the lengths of the diffraction grating 8 (the number of corrugations) of the first region and the second region differ from each other. That is to say, the position of the phase shift is drawn, in this example, further to the right than the center of the diffraction grating 8, and consequently, the diffraction grating in the first region is longer than that in the second region. Accordingly, the intensity of the Bragg reflection in the first region of the longer diffraction grating 8 is higher than that in the second region, whereas the laser output is larger in the second region in which the Bragg reflection intensity is lower than that in the first region.

The DFB laser, as noted previously, oscillates exactly at the Bragg wavelength, that is, in the case of a first order diffraction grating, at a wavelength twice the period of the corrugations, and the output distribution is determined by the Bragg reflection intensities in the first region and the second region.

Therefore, when the diffraction grating 8 is made longer on the side of the first region to intensify the Bragg reflection therein as in the case of FIG. 2, an optical fiber or the like is connected to the side of the second region of the larger light output to send out the main output and the light output from the side of the first region of smaller light output is used as a monitor output, by which the light output of the laser can be utilized efficiently.

(Embodiment 2)

Figure 3:
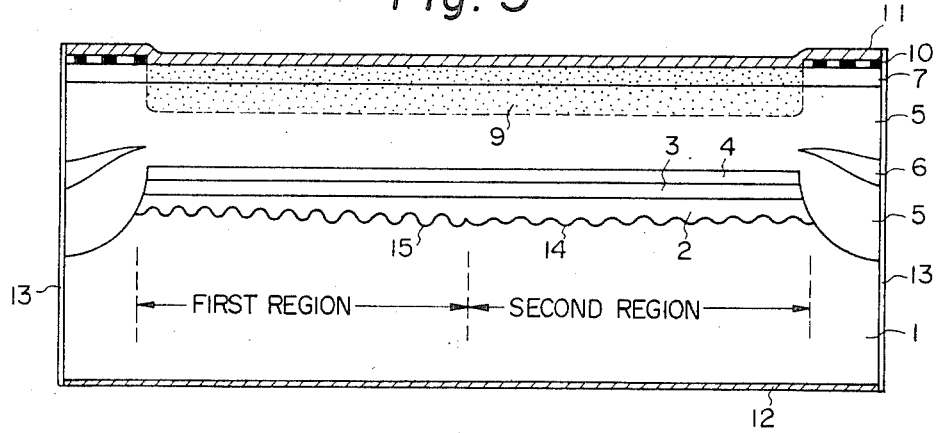

FIG. 3 illustrates another embodiment of the present invention, in which periodic corrugations 15 and 14 in the first region and the second region are formed to different depths to make the intensities of the Bragg reflection of the respective regions different from each other. In this case, the Bragg reflection intensity increases with an increase in the depth of the periodic corrugations, and decreases with a decrease in the depth of the corrugations. Accordingly, in case of FIG. 3, the Bragg reflection instensity is higher in the first region of the deeper corrugations than in the second region, and the main light output is sent out from the side of the second region as in case of FIG. 2. Incidentally, the first region and the second region are substantially equal in length to each other in this case.

To make the intensities of the Bragg reflections in the first region and the second region asymmetrical as described above will somewhat degrade the selectivity of a single wavelength, but this will not pose any problem in practice because the selectivity of a single wavelength of the phase-shift DFB laser is originally very high.

While the foregoing description has made no reference to a stripe structure for the lateral mode stabilization, the present invention is also applicable to various stripe structures such as a buried heterostructure and a planarconvex waveguide structure. Moreover the semiconductor material is not limited specifically to the aforementioned InGaAsP/InP series but may also be the AlInGaAs/InP series, the AlGaAs/GaAs series and the like.

(Merits of the Invention)

As will be appreciated from the foregoing description, according to the present invention, the intensities of the Bragg reflection of the regions is made to differ from each other to make the laser output asymmetrical, the larger light output is used as a main output and the other smaller light output is used for monitoring purpose, so that it is possible to materialize a DFB laser which is efficient in practical use. Accordingly, the laser of the present invention can be applied to longdistance optical fiber communications, and hence is of great utility.

What we claim is:

1. A distributed feedback laser having a substrate, a DFB portion on said substrate comprising a light emitting layer and an adjoining layer having periodic corrugations extending in the direction of travel of light, and electrodes for effecting laser oscillations, a first DFB region and a second DFB region of said DFB portion contiguous with said first DFB region having laser light outputs asymmetrical in magnitude, the first DFB region and the second DFB region having means comprising the periodic corrugations therein for making Bragg reflections of the first DFB region different from the second DFB region so that said laser light outputs thereof are asymmetrical in magnitude, and the periodic corrugations having a phase shift between the first DFB region and the second DFB region by a value corresponding to one fourth of the wavelength of light.

2. A distributed feedback laser having a substrate, a DFB portion of said substrate comprising a light emitting layer and an adjoining layer having periodic corrugations extending in the direction of travel of light, and electrodes for effecting laser oscillations, a first DFB region of said portion and a second DFB region of said DFB portion contiguous with said first DFB region having the periodic corrugation therein differing in length from each other to effectively make the intensities of Bragg reflection of the first DFB region differ from that of the second DFB region so that laser light outputs of the first DFB region and the second DFB region are asymmetrical in magnitude, and the periodic corrugations having a phase shift between the first DFB region and the second DFB region by a value corresponding to one fourth of the wavelength of light.

3. A distributed feedback laser having a substrate, a DFB portion on said substrate comprising a light emitting layer and an adjoining layer having periodic corrugations extending in the direction of travel of light, and electrodes for effecting laser oscillations, a first DFB region of said portion and a second DFB region of said DFB portion contiguous with said first DFB region having the periodic corrugations therein differing in depth from each other effective to make the intensities of Bragg reflection different from each other in the DFB regions so that laser light outputs of the first and second DFB regions are asymmetrical in magnitude, and the periodic corrugations having a phase shift between the first DFB region and the second DFB region by a value corresponding to one fourth of the wavelength of light.

* * * * *